United States Patent [19]

Furuhashi

[11] 3,725,754

[45] Apr. 3, 1973

[54] TRANSISTOR CIRCUIT OF COMPOUND CONNECTION

[75] Inventor: Tokio Furuhashi, Tokyo, Japan

[73] Assignee: Nippon Electric Company, Limited, Tokyo, Japan

[22] Filed: June 15, 1972

[21] Appl. No.: 263,272

[30] Foreign Application Priority Data

June 29, 1971 Japan ................................46/47778

[52] U.S. Cl. ..................317/235, 307/303, 307/313, 307/315, 330/17, 330/20

[51] Int. Cl.............................H01l 19/00, H03f 1/10

[58] Field of Search ..330/17, 20; 307/303, 313, 315, 307/288

[56] References Cited

UNITED STATES PATENTS

| | | | |
|---|---|---|---|
| 3,197,710 | 7/1965 | Lin | 330/38 |
| 3,437,945 | 4/1969 | Duncan | 330/13 |

*Primary Examiner*—John W. Huckert
*Assistant Examiner*—Joseph Clawson, Jr.
*Attorney*—Nichol M. Sandoe et al.

[57] ABSTRACT

A compound connection transistor circuit in which an additional transistor is connected between a pair of transistors of opposite polarities, to thereby prevent undesired oscillation of the circuit.

5 Claims, 4 Drawing Figures

TRANSISTOR CIRCUIT OF COMPOUND CONNECTION

The present invention relates generally to transistor circuits and, more particularly, to a compound connection transistor circuit comprising an NPN transistor and a PNP transistor combined to function as a single PNP transistor.

In the manufacture of a semiconductor integrated circuit formed in a P-type silicon substrate, difficulty is usually encountered in forming a PNP transistor that is capable of providing high current amplification. The lateral PNP transistor, which is a known PNP transistor, has P-type emitter and collector regions disposed laterally in an N-type base region. The lateral PNP transistor, however, has a low current gain. Other types of PNP transistors also have low current gains.

To solve this problem, it has been proposed that a PNP transistor and an NPN transistor having a high current gain be combined to function as an equivalent single PNP transistor, to thereby obtain a higher current gain. The combination of two transistors in the prior art is usually achieved by combining the collector of the PNP transistor to the base of the NPN transistor, and the emitter of the PNP transistor to the collector of the NPN transistor. In this circuit, the base of the PNP transistor is used as the base of the compound connection, the emitter of the NPN transistor is used as the collector, and the junction of the emitter of the PNP transistor and the collector of the NPN transistor is used as the emitter.

This compound circuit, however, has certain drawbacks. First of all, the circuit generates an oscillation at a specific frequency as a result of the large phase difference appearing between the emitter and the collector of the PNP transistor. The frequency of this unwanted oscillation is a function of the structure of the transistor used. When the width of the base of the PNP transistor is relatively large, the oscillation frequency of the compound circuit is relatively low such that normal operation in the transistor's frequency band is adversely affected. The base width must therefore be made smaller than a certain level. However, it is extremely difficult to precisely control the width of the base in the manufacture of a conventional PNP transistor, so that it is difficult to predict the frequency of the resulting undesirable oscillation.

The undesirable oscillation may be prevented by forming a bypass between the base of the NPN transistor and ground. This bypass, however, requires the use of a capacitor, which cannot be formed on the same substrate of an integrated circuit device and must thus be added as an external element to complicate the device as a whole. This bypass capacitor may be formed in the substrate, but this would inevitably result in a bulkier semiconductor device.

It is therefore an object of this invention to provide a compound connection transistor circuit which is well suited for fabrication as an integrated circuit and capable as well of preventing undesirable oscillation without resorting to the use of an additional capacitive element.

According to the present invention, a compound connection transistor circuit includes a first transistor of PNP (or NPN) type. A second transistor of NPN type (or PNP type) has its base connected to the collector of the first transistor, and an additional transistor of PNP (or NPN) type has its base connected to the emitter of the first transistor, and its emitter connected to the collector of the second transistor, to thereby form an equivalent single PNP (or NPN) transistor.

The present invention has several significant technical advantages over the conventional devices of this type. Stated briefly, the gain of the internal feedback loop of the compound connection in the circuit of the invention is less than unity as a result of the additional transistor, and thus no oscillation is caused. The circuit of the invention has the further advantage in that no capacitive element is required in an external arrangement. The current gain of the present circuit is not sacrificed since an extra transistor is employed without occupying any appreciable additional space on the surface of the substrate.

The above mentioned objects, features, and advantages of this invention will be more apparent from the following detailed description taken in conjunction with the accompanying drawing, wherein.

Figure 1:
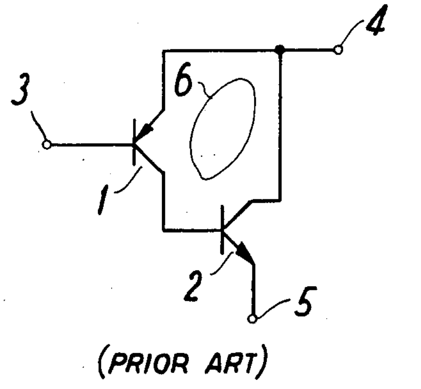
FIG. 1 is a circuit diagram of a conventional compound connection transistor circuit.

Referring now to the prior art compound connection transistor circuit illustrated in FIG. 1, the collector of a PNP transistor 1 is connected to the base of an NPN transistor 2 which has a current gain greater than that of the PNP transistor 1. The collector of NPN transistor 2 is connected to the emitter of PNP transistor 1. A terminal 3 from the base of the PNP transistor 1 is used as the base terminal of the compound circuit, a terminal 4 from the emitter of PNP transistor 1 is used as the emitter terminal, and a terminal 5 from the emitter of NPN transistor 2 is used as the collector terminal of the compound connection circuit. This compound connection circuit functions as the equivalent of a single PNP transistor and has a high current gain.

The PNP transistor 1, when fabricated in the form of an integrated circuit using a P-type substrate, usually has inferior characteristics which cause the signals at its emitter and collector to have a large phase difference. This causes the loop 6 (defined by the collector of PNP transistor 1 — the base of NPN transistor 2 — the collector of NPN transistor 2 — the emitter of PNP transistor 1 — the collector of PNP transistor 1) to develop a positive feedback at a specific frequency, thereby bringing the circuit into an oscillatory state. The resulting oscillation frequency may be as low as several megahertz, especially when PNP transistor 1 is formed as a lateral PNP transistor.

This undesirable oscillation may be prevented by reducing the gain of loop 6 or, in other words, by decreasing the current gain of NPN transistor 2. However, the decrease of the current gain of NPN transistor 2 does not serve the purpose of realizing a high current gain of the compound connection circuit as a whole.

The oscillation frequency depends largely on the base width of PNP transistor 1. To prevent this oscillation at a low frequency range, which may extend to the operating frequency of the circuit, the base width of transistor 1 must be as small as possible. However, it is very difficult to limit the base width of a transistor to a very small value in the process of manufacturing the transistor. Also, the required precise control of the base width in the manufacturing process would complicate the control system needed for the mass production of the semiconductor integrated circuit, and thereby lower the yield of satisfactory transistors.

Another approach to the prevention of the undesirable oscillation is to insert a bypass capacitor between the base of NPN transistor 2 and ground. If that capacitor were incorporated into the substrate, a wider substrate area would be needed, thereby deteriorating the miniaturization of the integrated circuit.

The present invention overcomes these drawbacks by providing a novel arrangement wherein an additional PNP transistor is incorporated between the emitter of the PNP transistor and the collector of the NPN transistor of the prior art circuit of FIG. 1, so that the base-emitter junction of the additional PNP transistor is connected in the same direction with respect to the base-emitter junction of the PNP transistor. The current gain of the additional PNP transistor in the grounded emitter circuit configuration is determined so that the overall loop gain is less than unity.

Figure 2:
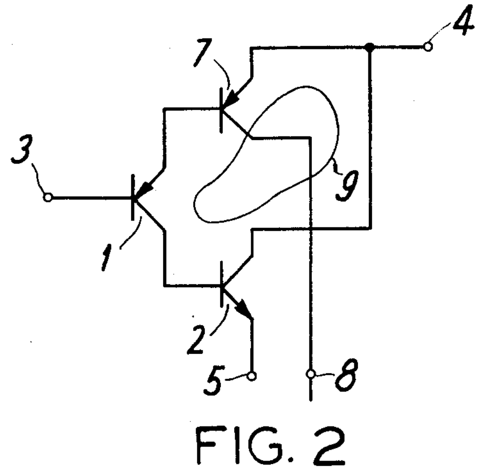
FIG. 2 is a circuit diagram of a compound connection transistor circuit according to one embodiment of this invention.

Referring now to the circuit diagram of the novel combination circuit of the invention, in the embodiment thereof illustrated in FIG. 2, an additional PNP transistor 7 is inserted in the prior art circuit of FIG. 1. Corresponding circuit elements in the circuits of FIGS. 1 and 2 are designated by corresponding reference numerals in the two figures. The base of additional PNP transistor 7 is connected to the emitter of first PNP transistor 1, and the emitter of transistor 7 is connected to the collector of NPN transistor 2. The collector of additional PNP transistor 7 is connected to a terminal 8 which serves as the collector terminal of the overall circuit. A voltage is applied between terminals 4 and 8 through a load impedance (not shown in FIG. 2). Terminal 5 shown, as in FIG. 1, as being connected to the emitter of NPN transistor 2, may also be directly connected to terminal 8. In another aspect of this invention, as described below with reference to the embodiment of the invention illustrated schematically in FIG. 3, terminal 5 may be connected to terminal 8 through a resistor (not shown in FIG. 2) which may be used for detecting an excessive current or for other purposes.

As illustrated in FIG. 2, the emitter-base junction of additional PNP transistor 7 is inserted in a loop 9 (defined by the collector of PNP transistor 1 — the base of NPN transistor 2 — the collector of NPN transistor 2 — the emitter of additional PNP transistor 7 — the base of additional PNP transistor 7 — the emitter of PNP transistor 1 — the collector of PNP transistor 1), and the base current of additional PNP transistor 7 is of a value equal to the inverse number of the current gain $h_{FE3}$ of additional PNP transistor 7. Hence the gain of loop 9 is decreased to a value about $1/h_{FE3}$ times as great as that of loop 6 of the prior art circuit of FIG. 1. The value of the current gain $h_{FE3}$ of transistor 7 is suitably determined to keep the gain of loop 9 below unity.

Thus, the compound connection transistor circuit of the invention does not produce any parasitic oscillation. Furthermore, the overall current gain obtained in the grounded-emitter circuit configuration of the circuit can be increased by resorting to a high current gain $h_{FE2}$ of NPN transistor 2 for the grounded emitter configuration. When a load is connected to terminal 4 to use the compound connection transistor circuit as an emitter follower, the current supply to the load can be significantly increased. More specifically, the emitter current of PNP transistor 1 can be expressed as $i_B+i_B \cdot h_{FE1}$ (where $i_B$ is the base current of terminal 3). Similarly the emitter current of additional PNP transistor 7 can be expressed as $(i_B+i_B \cdot h_{FE1}) + (i_B+i_B \cdot h_{FE1})h_{FE3}$. The sum of the emitter current of additional PNP transistor 7 and the collector current of NPN transistor 2 expressed as $i_B \cdot h_{FE1} \cdot h_{FE2}$ is supplied to terminal 4. This total current is larger than that obtainable with the prior art circuit of FIG. 1 by the value $(i_B+i_B \cdot h_{FE1})h_{FE2}$.

Figure 3:
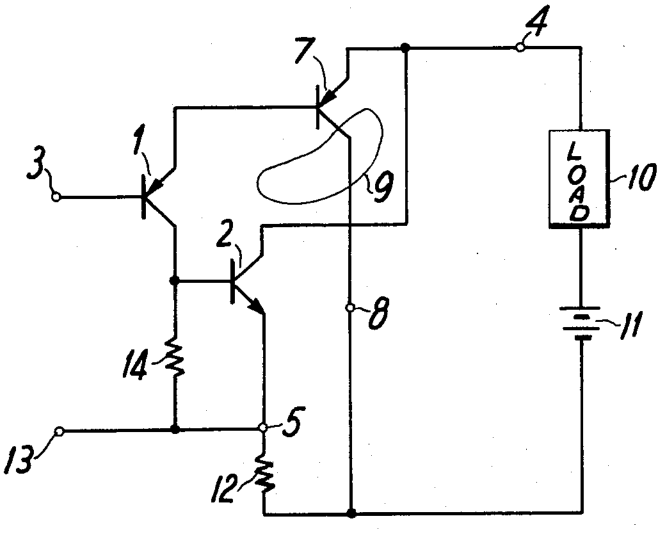
FIG. 3 is a circuit diagram showing a preferred embodiment of this invention as applied to an amplifier.

Referring now to FIG. 3, a preferred application of the present invention to an emitter-follower circuit is shown in which circuit elements corresponding to those shown in the circuit of FIG. 2 are designated by corresponding reference numerals. The terminal 4 is connected to the positive electrode of a power source 11 through a load 10, and terminal 8 is connected to the negative electrode of power source 11. A resistor 12 is connected between terminals 5 and 8. Excessive load current is detected by means of resistor 12 at a terminal 13 which is connected to terminal 5. A resistor 14 is connected between the base and collector of NPN transistor 2. The collector current of PNP transistor 1 is caused to flow through resistor 14 to bring NPN transistor 2 to an operating state.

Figure 4:
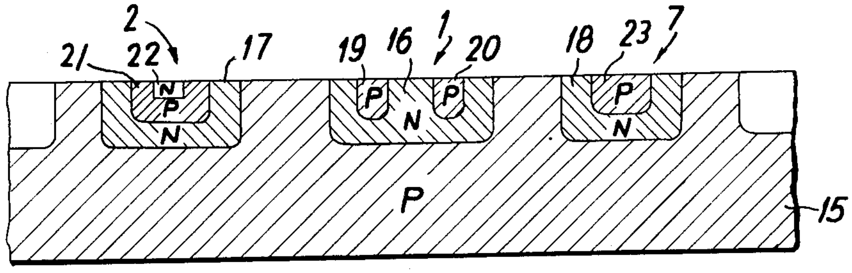
FIG. 4 is a cross-sectional view of the structural features of the transistors used in the circuit embodiment of FIG. 3.

The circuit of FIG. 3 can be made into an integrated circuit device shown in vertical cross-section in FIG. 4, in which transistors 1, 2 and 7 are formed as shown. Mutually separated N-type regions 16, 17 and 18 are formed on a P-type semiconductor substrate 15. Two laterally disposed P-type regions 19 and 20 are formed in N-type region 16 to constitute PNP transistor 1. A P-type region 21 is formed in region 17, and an N-type region 22 is also formed in P-type region 21, whereby NPN transistor 2 is formed. Furthermore, a P-type region 23 is formed within N-type region 18, whereby an additional PNP transistor 7 having P-type region 23 as the emitter, N-type region 18 as the base, and substrate 15 as the collector is formed.

In this circuit, since collector terminal 8 is held at a minimum potential, it is possible to construct additional PNP transistor 7 as shown in FIG. 4. Hence the circuit can be designed such that, when the emitter current is considerably increased, the current gain of additional PNP transistor 7 decreases more rapidly than that of NPN transistor 2. Thus, in the event of excessive load current flow, most of this excessive current is caused to flow through NPN transistor 2 and not through additional PNP transistor 7. This results in the rapid increase in the voltage drop across resistor 12, and permits terminal 13 to serve as the excessive load current detection terminal. This detected output can be utilized, for example, to actuate an external protective circuit.

The present invention has been described in connection with semiconductor integrated circuits formed in a P-type semiconductor substrate. It will be apparent to those skilled in this art, however, that the circuit of the present invention is applicable as well to semiconductor integrated circuits formed in an N-type semiconductor substrate by replacing PNP transistors 1 and 7 with NPN transistors, and replacing NPN transistor 2 with a PNP transistor. It will also be apparent that the circuit of the invention is applicable to a compound connection transistor circuit constituted of separate transistors not in the form of an integrated circuit device as herein specifically shown. Furthermore, in the foregoing specifically described embodiments of the invention, the base-emitter junction of the additional PNP transistor is inserted between the emitter of the PNP transistor and the collector of the NPN transistor. Alternatively, the base-emitter junctions of a plurality of such PNP transistors may be inserted therebetween in cascade and in the same direction without departing from the teaching of the invention.

Although a few embodiments of the invention and their modifications have been herein described in detail together with specific embodiments thereof, it is to be understood that the scope of the invention is not limited thereto or thereby.

What is claimed is:

1. A transistor circuit of the compound connection comprising a first transistor having a base, an emitter, and a collector, a second transistor of an opposite polarity to said first transistor and having a base, an emitter, and a collector, said second transistor having its base connected to the collector of said first transistor, and a third transistor of a polarity identical to that of said first transistor having a base connected to the emitter of said first transistor and an emitter connected to the collector of said second transistor.

2. The compound-transistor circuit as claimed in claim 1, in which said first and third transistors are of PNP, and said second transistor is of NPN.

3. The compound-connected transistor circuit as claimed in claim 1, in which said first transistor is of the type having its emitter and collector regions laterally arranged in its base region.

4. The compound-transistor circuit as claimed in claim 1, further comprising a resistor coupled between the emitter of said second transistor and the collector of said third transistor.

5. The compound-transistor circuit of claim 1, in which a closed loop is defined by the collector of said first transistor, the base and collector of said second transistor, the emitter and base of said third transistor, and the emitter of said first transistor, the gain of said closed loop being less than unity.

* * * * *